United States Patent [19]

Clemons

[11] Patent Number: 4,599,709
[45] Date of Patent: Jul. 8, 1986

[54] BYTE ORGANIZED STATIC MEMORY

[75] Inventor: Donald G. Clemons, Northampton, Pa.

[73] Assignee: AT&T Bell Laboratories, Murray Hill, N.J.

[21] Appl. No.: 581,289

[22] Filed: Feb. 17, 1984

[51] Int. Cl.[4] ............................................. G11C 11/40
[52] U.S. Cl. ..................................... 365/200; 365/189;
365/230
[58] Field of Search ......................... 365/200, 230, 189

[56] References Cited

U.S. PATENT DOCUMENTS

| | | | |
|---|---|---|---|
| 4,228,528 | 10/1980 | Cenker et al. ........................ | 365/200 |
| 4,241,425 | 12/1980 | Cenker et al. ........................ | 365/222 |
| 4,441,170 | 4/1984 | Focmsbee et al. .................... | 365/200 |
| 4,456,980 | 6/1984 | Yamada et al. ....................... | 365/200 |
| 4,462,091 | 7/1984 | Knepper et al. ...................... | 365/200 |

OTHER PUBLICATIONS

"A 64kb Full CMOS RAM with Divided Word Line Structure", 1983 Digest of Technical Papers, IEEE Int. Solid-State Cir. Conf., Masahiko Yoshimoto et al., Feb. 23-25, 1983, pp. 58-59.
"A HI-CMOSII 8Kx8b Static RAM", 1982 Digest of Technical Papers, IEEE Int. Solid-State Cir. Conf., Osamu Minato et al., Feb. 12, 1982, pp. 256-257, 332.

*Primary Examiner*—Terrell W. Fears
*Attorney, Agent, or Firm*—James H. Fox

[57] ABSTRACT

A static random access memory arrangement provides for accessing a desired number of bits (i.e., a byte) simultaneously by placing the accessed columns adjacent one another. For example, if the memory provides 8 bits when accessed, then a group of 8 adjacent columns is addressed, whereas the prior art provided for accessing one column out of each of 8 separate groups. The present scheme provides for improved utilization of spare columns for redundancy purposes, and also allows for partial row selection for reduced power consumption and noise.

6 Claims, 3 Drawing Figures

BYTE ORGANIZED STATIC MEMORY

BACKGROUND OF THE INVENTION

1. Field of the Invention

The present invention relates to a semiconductor memory architecture suitable for accessing a given number of static memory locations simultaneously.

2. Description of the Prior Art

Semiconductor random access memories have been most frequently implemented so as to access one memory location at a given time, especially in the case of dynamic random access memories (DRAMs). However, schemes have also been proposed for accessing several locations at a given time, in order to obtain faster access to a group of memory bits. Particularly in static random access memories (SRAMs), the multiple bit organization has become increasingly popular. For example, a 64 kilobit memory may be arranged so as to obtain 8 bits simultaneously for a read or write operation; such a memory is conventionally referred to as an 8K×8 bit memory. The frequent choice of 8 bits to be accessed simultaneously is due largely to the prevalence of 8 bit microprocessor architecture. However, other memory organizations such as 16 bits, etc. are possible.

The prior arrangement of multiple bit static memories is depicted schematically in FIG. 1. For convenience, a "by-four" memory is shown, wherein four bits are accessed simultaneously. For this purpose, the prior art organizations associated memory columns together in groups of columns, each referred to herein as an "I/O block", since each block is associated with a separate I/O line. For the by-four memory, four I/O blocks are utilized, with an accessed bit coming from one column of each I/O block, from memory cells located on the same row. For example, in FIG. 1 to obtain the four bits simultaneously, assume that the accessed memory locations are located on row 1. The particular group of four bits will be selected by activating the row one select line (R1) and the appropriate column select line. For example, by selecting the C1 line from the column decoder, the first column in each of I/O blocks 1, 2, 3, and 4 are accessed. Therefore, memory locations M111, M211, M311 (not shown), and M411 are accessed simultaneously under this condition. The other groups of four bits can similarly be accessed by selecting the appropriate row conductor and the appropriate column select conductor. For simplicity of illustration, the memory cells are shown to communicate with a single column conductor. However, in static memories a given memory location typically communicates with two parallel column conductors. Each conductor in a given pair is then driven to the opposite state (i.e., high or low) from the other conductor during a read or write access operation. Two column access transistors are then utilized, one for each column conductor. Both access transistors are activated by the same row select line.

In the prior art organization of FIG. 1, the output of each selected column in a given I/O block was directed to an associated I/O line (for example, I/O1, I/O2, I/O3 and I/O4), that communicated with a sense amplifier, for reading data from a memory cell, and with a data in buffer for writing data into a memory cell. Hence, for a by-four memory, typically four sense amplifiers are utilized. The arrangement shown allows relatively close spacing of the sense amplifier to the selected column allowing for rapid memory access. The column decoder is shown to the side of the memory array in FIG. 1, with the column select lines (C1 ... Cn) traversing the width of the array. However, it is also known to place the column decoding circuitry below the columns, with the I/O lines running therethrough to the sense amplifiers. In either case, the prior art I/O lines were significantly shorter than the width of the array, to ensure minimal capacitive loading on the I/O lines and hence fast access times.

Another trend that has developed in semiconductor memory design has been the use of spare memory cells to substitute for defective ones. This technique is generally referred to as redundancy. See U.S. Pat. No. 4,228,528 co-assigned with the present invention for a technique for removing defective rows or columns and substituting spare rows or spare columns by programming spare decoders by means of fusible links. To implement the spare column technique in prior art multiple bit static memories, one or more spare columns had to be provided for each I/O block. For example, in FIG. 1, to provide a spare column in I/O block 1, spare column C1S is provided, and for I/O block two, spare column C2S is provided, etc. To replace a defective column, the fusible link shown in the source path of the access transistor is blown. Then, the column address of the defective column is programmed into the spare decoder for that I/O block. Note that a spare column provides coverage only in its I/O block. That is, spare column C1S cannot substitute for a defective column in I/O block 2, but is limited to coverage of defective columns in I/O block 1. This is because in the prior art I/O block organization, spare column C1S can be connected only to I/O line 1 (through access transistor T103). Since a separate I/O block is connected to a separate I/O line, the spare coverage is thus limited. This has a substantial drawback, since one common type of defect in a memory is the shorting together of column conductors in two adjacent columns. Hence, to allow repair of this defect, at least two spare columns must be provided per I/O block. However, a large percentage of these spares will not in practice be used, meaning that chip area is not used efficiently to provide for redundancy.

The design of dynamic random access memories has evolved along a different path. This is because typically only a single memory cell is accessed at one time. Therefore, a single I/O line can be provided per memory portion, so that a spare column can replace any defective column over the entire portion. (By "portion" is meant an activated sub-array, discussed below.) This had the desirable effect of allowing very efficient use of spare columns for redundancy purposes. However, it implied that the I/O line was physically longer than the I/O line in a static memory of comparable size. This tended to slow down the access time somewhat, due to the extra capacitive loading of the longer I/O line. However, as a percentage of total access time, the penalty was less for DRAMs than SRAMs, since the DRAMs had somewhat longer access times anyway, for various other reasons. In at least one prior art DRAM design, additional I/O lines were provided, in order to avoid placing all of the decoder circuitry necessary to access a given column in the pitch (i.e., minimum spacing as defined by the memory cell size) of the columns. The inclusion of all such decoder circuitry therein would have resulted in a wider spacing of the columns than was necessary for the dynamic memory cells, resulting in wasted area on the chip. To avoid this waste, 4 I/O lines have been provided, each accessing a column in groups of 4 adjacent columns. Then a 1 of 4 selector chooses one of the 4 I/O lines to communicate with an external input/output pin. Thus, the multiple I/O line configuration for dynamic random access memories merely allowed for convenient placement of decoder circuitry, but did not otherwise make use of the presence of the multiple bits simultaneously present on the I/O lines.

Still another trend that has developed in semiconductor memories is dividing the memory array into portions; for example, into four quadrants. An advantage of this technique is that each individual portion can be accessed for a read or write operation while keeping the other portions in a low power state for reduced power consumption. Furthermore, columns and rows can be shorter, providing for a reduced capacitance on the row and column conductors for decreased access time. For this purpose, it is desirable to provide for a so called divided word line, wherein a single row decoder can provide access to two memory portions lying on either side of the decoder. One portion or the other is then accessed by activating only the word line connected to that portion, without the necessity of driving the entire word line. Hence, a single decoder can be utilized in order to save space, and the reduced length of the word line results in reduced word line capacitance and hence a reduction in access time. However, referring again to FIG. 1 it can be seen that it is not very feasible to divide the rows between I/O blocks, since only a portion of the desired bits that form a byte would then be available. For example, if division occurred between I/O block 2 and I/O block 3, then I/O blocks 1 and 2 would have to be accessed in order to obtain bits 1 and 2, whereas I/O blocks 3 and 4 would have to be accessed at another time in order to obtain bits 3 and 4 of the full 4 bit byte.

Hence, it is desirable to have a memory organization that provides for improved utilization of spare columns, while allowing for subdivision of the memory into portions.

SUMMARY OF THE INVENTION

I have invented a static random access memory that accesses a multiplicity of bits (i.e. a byte) simultaneously. The memory comprises blocks of memory columns, wherein the bits in an accessed byte are stored in adjacent columns in a block. Each column within a block communicates with a separate input/output line. The columns in at least one block share the same input/output lines with the columns of at least one other block. One or more spare columns may be provided, for replacing a defective column connected to the input/output lines. In one embodiment of the invention, a given row decoder provides access to two or more memory portions, each comprising the above noted block and spare architecture.

DETAILED DESCRIPTION

The present detailed description relates to an improved memory architecture for obtaining multiple bit access in a static memory. As used herein, the term "byte" refers to the multiple bits that are accessed at one time. While a byte can be 8 bits, the term is used herein in the more generic sense as referring to the quantum of data that is accessed at one time. For example, a 4 bit byte is used for illustrative purposes herein. The term "static" refers to memory cells that are not periodically refreshed by circuitry external to the circuitry of the memory cells. Typical static memory cells employ 2 cross-coupled field effect transistors and 2 load resistors, or alternately 2 cross-coupled field effect transistors and 2 load transistors. In addition, each cell typically includes two access transistors, each connected to one of two column conductors. Both single transistor types (e.g., n-channel metal oxide semiconductor field effect transistors) and complementary transistor types (e.g., complementary metal oxide semiconductor field effect transistors) are known in the art for use in the memory cell. Furthermore, the term "static" herein includes the so-called pseudo static memory cells, wherein individual refresh circuitry is provided for a dynamic memory cell, making it appear to be a static cell to an external circuit; see, for example, U.S. Pat. No. 4,030,083 co-assigned with the present invention.

Figure 1:
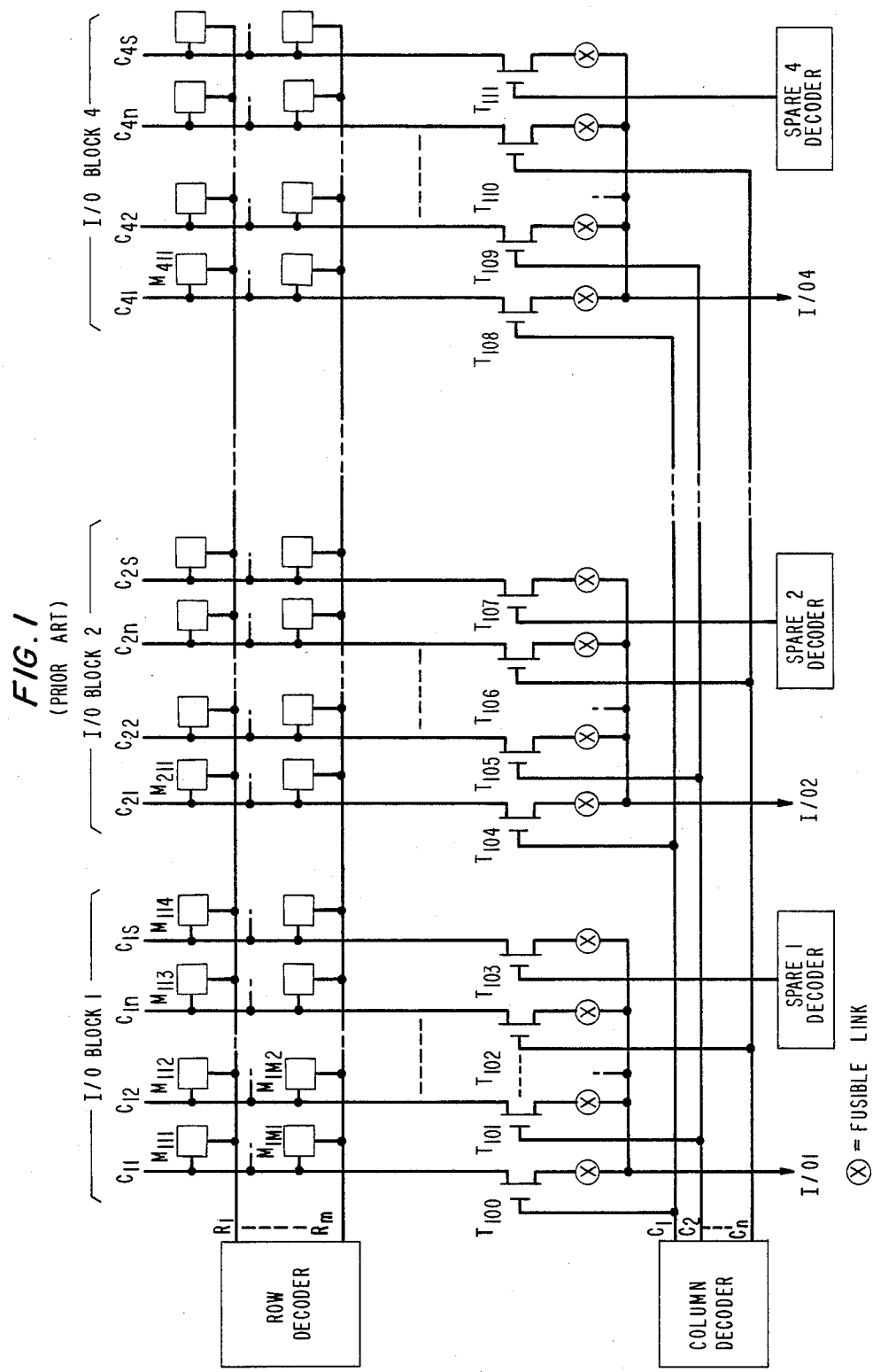
FIG. 1 illustrates a prior art memory organization providing multiple bit accessing.
Figure 2:
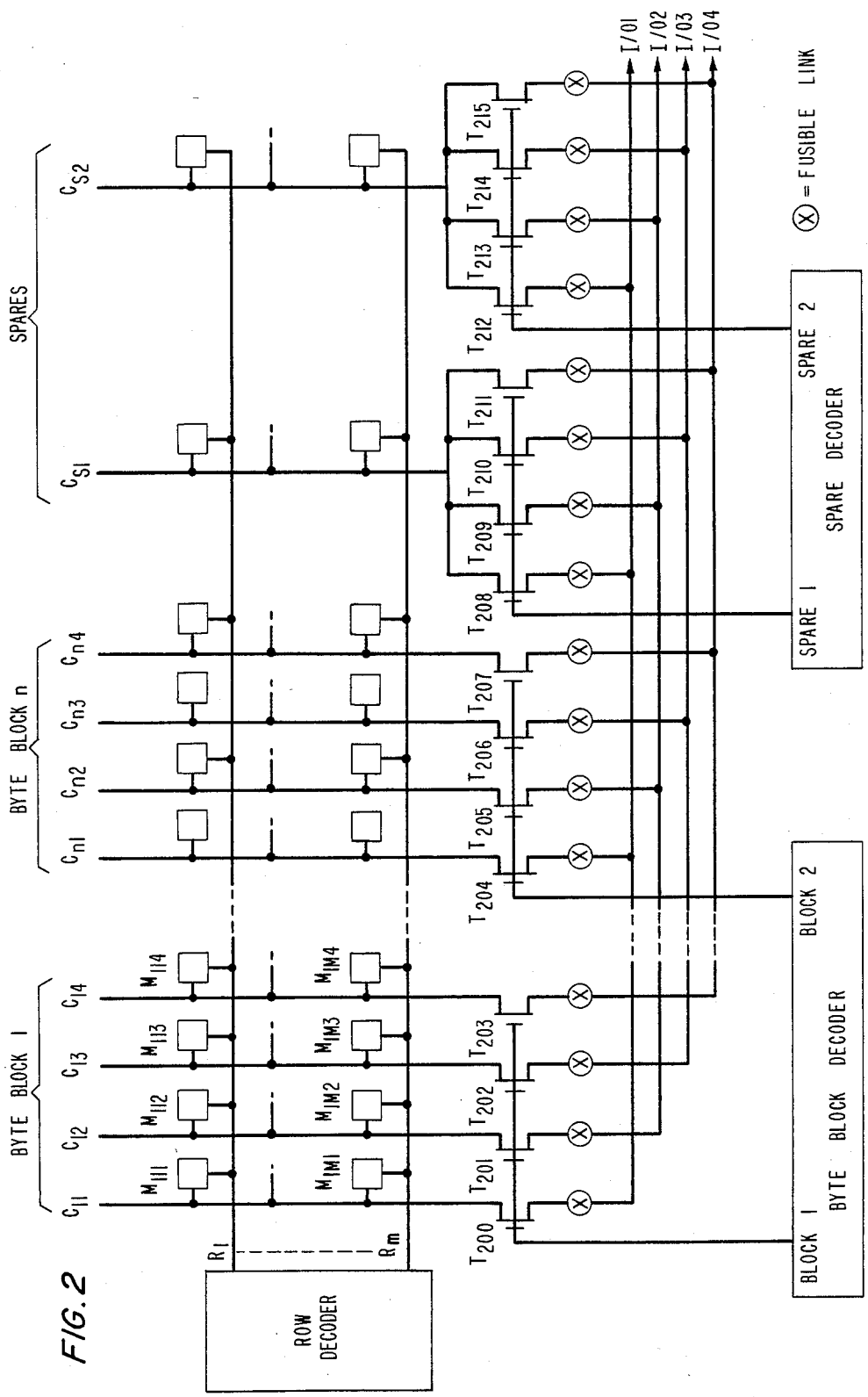
FIG. 2 shows the multiple bit memory organization of the present invention.

Referring to FIG. 2, a four bit byte architecture is illustrated. The row decoder provides for selection of any one of M rows, with a given memory cell (M111, etc.) being accessed when its corresponding row and column is accessed. For simplicity of illustration, a single column is shown as communicating with each memory cell. However, as is apparent to a person of skill in the art, typical static memory cells communicate with two parallel column conductors. Typically only one row conductor is necessary to access a given cell. In the present technique, all the bits of the byte accessed in a given operation are obtained from physically adjacent columns, referred to herein as "byte blocks", as distinguished from "I/O blocks" of the prior art. For the illustrative case of FIG. 2, this means four adjacent columns form a byte block. While the byte blocks are shown physically separated from each other in FIG. 2 for convenience of illustration, this need not be the case, but rather all the columns may be equally spaced. Each column is accessed by accessing means, shown herein as access transistors (T200, etc.). Note that in the present technique all of the access transistors for a given byte block are accessed simultaneously by a signal from a byte block decoder. The simultaneous access may be provided by connecting the gates of all the access transistors in a given byte block together, as illustrated. Alternately, each access transistor may be controlled separately by decoder circuitry that activates the transistors simultaneously; other simultaneous access techniques are also possible.

Each column conductor communicates with an input/output line through a fusible link as shown. Typically, the fusible links provide a conductive path as fabricated and are disconnected as required by laser radiation in order to eliminate a column that is found to be defective on testing the memory chip. Spare columns CS1 and CS2 are shown, each of which can be substituted for a defective column in any of the byte blocks, or for a defect in the other spare column. In any case, at least one spare column is provided, but additional spare columns can be added as desired. Two column conductors may be employed per column, coupled to a pair of input/output conductors, with only one conductor per pair being shown for clarity of illustration. Each pair of input/output conductors is considered to be an input/output "line" as used herein. The spare columns are activated by a spare decoder as indicated. The spare decoder can be in the form of a tree decoder, wherein transistors are activated in order to encode the desired memory address of the column that is to be replaced.

Referring again to FIG. 2, it is apparent that in the present technique each spare column provides coverage for all of the columns in a memory portion. Therefore the efficiency of utilization of the spares is greatly increased. This is because a spare need not be dedicated to each individual byte block. To repair a defective column, the fusible link in that column (e.g., $C_{n2}$) is blown (i.e. opened). Then, the spare column to be substituted (e.g., $C_{s1}$) is disconnected from all the other I/O lines (e.g., I/O1, I/O3, and I/O4) by blowing the fusible links connected to the respective spare column access transistors therefore (e.g., T208, T210, T211). This leaves the spare column connected only to the I/O line (e.g. I/O2) of the column to be replaced. Then, the address of the defective column is programmed into the spare decoder by blowing appropriate links therein. Furthermore, by providing two (or more) spare columns, the above noted case of shorts between conductors in adjacent columns can be repaired in a similar manner.

Figure 3:
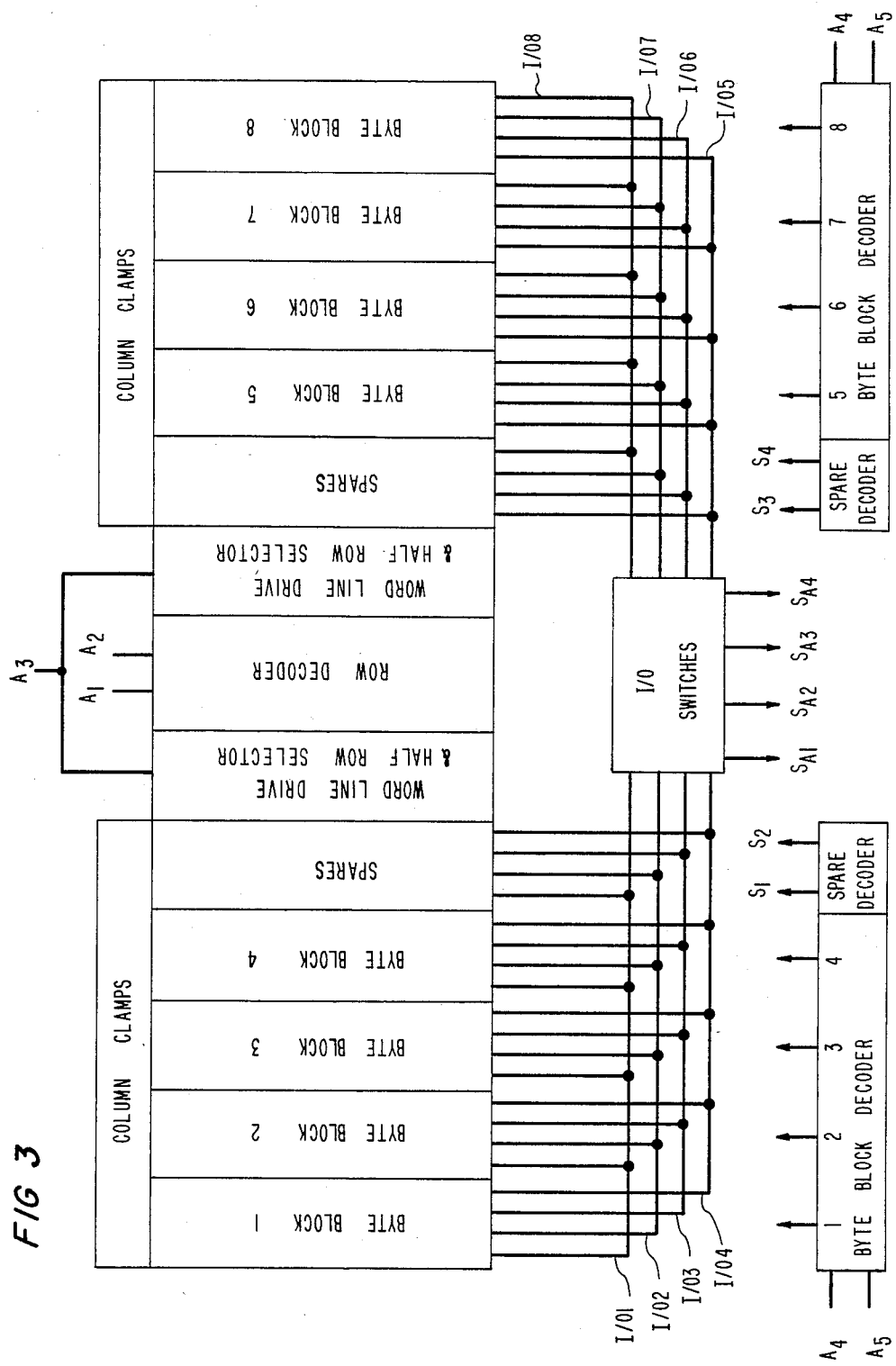
FIG. 3 shows the present invention implementing a divided word line structure.

Referring to FIG. 3, it can be seen how the present invention allows for dividing the memory into portions. Rather than having one continuous row, each row decoder communicates with two (or more) partial rows, with one partial row to the left and one to the right of the row decoder as viewed in FIG. 3. For example, if access to the left-hand portion of the memory is desired, only the word line drivers to the left of the row decoder are activated, thereby activating a half row that traverses byte blocks 1 through 4. The word line driver for that portion of the same row that traverses byte blocks 5 through 8 is not activated. For illustrative purposes, consider that four rows are present. A given row is then selected by address bits A1, A2. Additionally, the appropriate word line driver for the desired half row is selected by address bit A3. Further subdivision into more than two partial rows is also possible. The division into partial rows can be accomplished in the present technique, while still providing for access to the desired multiplicity of bits, because each byte block is in effect a self contained unit. That is, all of the bits in a given byte are arranged to be on one side of the row decoder. In this manner, shorter rows are accommodated for reduced row conductor capacitance, or alternately a saving in the number of row decoders is accomplished. Furthermore, by accessing only a portion of the memory, a saving in column current is accommodated. Typically, the columns in the unactivated portion remain in a quiescent state; i.e., drawing substantially no column current.

The remaining portions of the address bits (A4 and A5) provide for the selection of one of the four blocks within the selected portions, by means of the block decoder as indicated. To isolate the input/output lines connected to the active portion of the memory from the input/output lines connected to the inactive portion of the memory, an I/O switch can be provided as shown. This circuit can be controlled by the address (A3) for selecting the appropriate I/O line half to be connected to the output as indicated. The I/O lines selected by the I/O switch can feed one sense amplifier and data in buffer for each I/O line selected. Alternately, sense amplifiers and data in buffers can be provided for each I/O line half, with the outputs of the sense amplifiers and data in buffers (eight of each in this case) being selected by the I/O switch. Each of the selected I/O lines communicates externally from the memory array via a separate conductor. For example, the by-four architecture shown typically is utilized in a package providing four input/output pins. While spare columns have been discussed herein, it is of course also possible to include spare rows in the present design, according to prior art methods. Still other organizations can be accomplished.

All such variations and deviations through which the teachings of the present invention have advanced the art are considered within the spirit and scope of the present invention.

What is claimed is:

1. An integrated circuit comprising an array of static memory cells arranged in rows and columns;
means for providing access to a plural number of memory cells in said array by simultaneously selecting a number of columns equal to said plural number;
and means for coupling the selected columns to an equal number of input/output terminals of said integrated circuit,
characterized in that
said means for providing access is adapted to select columns that are adjacent to one another in a block of columns in said array, wherein said array comprises at least two blocks of columns, and the number of columns in each of the said blocks equals said plural number.

2. The integrated circuit of claim 1 further comprising at least one spare column of memory cells adapted to replacing a defective column of memory cells located in said blocks of columns.

3. The integrated circuit of claim 1 further comprising a row decoder that is adapted to selecting a portion of a given row of memory cells.

4. The integrated circuit of claim 3 wherein said portion includes memory cells located in at least two of said blocks of columns.

5. The integrated circuit of claim 1 wherein said array is divided into at least two portions separated by row decoders, wherein each of said portions comprises at least two of said blocks of columns.

6. The integrated circuit of claim 5 further comprising at least one spare column of memory cells for each of said portions, and adapted to replacing a defective column of memory cells located in any of said blocks in a given portion.

* * * * *